US011211922B2

(12) United States Patent
Tsuji

(10) Patent No.: US 11,211,922 B2
(45) Date of Patent: Dec. 28, 2021

(54) VOLTAGE COMPARATOR FOR OFFSET COMPENSATION

(71) Applicant: ROHM Co., LTD., Kyoto (JP)

(72) Inventor: Masanobu Tsuji, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/084,943

(22) Filed: Oct. 30, 2020

(65) Prior Publication Data
US 2021/0135596 A1    May 6, 2021

(30) Foreign Application Priority Data
Oct. 31, 2019   (JP) .............................. JP2019-198285

(51) Int. Cl.
| | |
|---|---|
| *H03K 5/24* | (2006.01) |
| *H02M 7/537* | (2006.01) |
| *G01R 19/165* | (2006.01) |
| *H03K 5/153* | (2006.01) |
| *H03K 5/22* | (2006.01) |
| *H02M 7/483* | (2007.01) |

(52) U.S. Cl.
CPC ..... *H03K 5/2472* (2013.01); *G01R 19/16552* (2013.01); *H02M 7/537* (2013.01); *H03K 5/153* (2013.01); *H03K 5/22* (2013.01); *H03K 5/24* (2013.01); *H02M 7/4835* (2021.05)

(58) Field of Classification Search
CPC .. H02M 7/537; H02M 7/4835; H03K 5/2472; H03K 4/50; H03K 5/24; H03K 5/22; H03K 5/53; H03K 5/153; G01R 19/16552
See application file for complete search history.

(56) References Cited

U.S. PATENT DOCUMENTS

| | | | | |
|---|---|---|---|---|
| 5,262,686 A | * | 11/1993 | Kurosawa .............. | H03K 5/249 327/362 |
| 5,281,860 A | * | 1/1994 | Krenik ................. | G11C 27/026 327/336 |
| 5,402,128 A | * | 3/1995 | Kusumoto .......... | H03M 1/0678 341/159 |

(Continued)

OTHER PUBLICATIONS

Geert Van der Plas et al., A 0.16pJ/Conversion-Step 2.5mW 1.25GS/s 4b ADC in a 90nm Digital CMOS Process, 2006 IEEE International Solid State Circuits Conference—Digest of Technical Papers, San Francisco, CA, 2006, p. 2310-.

(Continued)

*Primary Examiner* — Yusef A Ahmed
(74) *Attorney, Agent, or Firm* — Chip Law Group

(57) ABSTRACT

Disclosed herein is a voltage comparator including a first capacitor, a first inverter and a first switch connected in series and provided between both ends of the first capacitor, a second inverter connected in parallel with the first inverter, a second switch provided between an input and an output of the first inverter, a third switch provided between an input and an output of the second inverter, a second capacitor provided between the output of the first inverter and the input of the second inverter, a third capacitor provided between the output of the second inverter and the input of the first inverter, and a fourth switch provided in one of a position between an upper electrode of the first capacitor and a power supply line and a position between a lower electrode of the first capacitor and a ground line.

6 Claims, 11 Drawing Sheets

(56) References Cited

U.S. PATENT DOCUMENTS

| | | | | |
|---|---|---|---|---|
| 5,546,028 A * | 8/1996 | Yamaguchi | ........... | H03K 5/2481 327/64 |
| 5,635,864 A * | 6/1997 | Jones | ............. | H04N 5/211 327/77 |
| 5,798,725 A * | 8/1998 | Okada | ............. | H03K 5/249 341/158 |
| 5,818,267 A * | 10/1998 | Fujio | ............. | G01R 19/0038 327/58 |
| 5,821,780 A * | 10/1998 | Hasegawa | ............. | H03K 5/2445 327/63 |
| 5,905,387 A * | 5/1999 | Chinosi | ............. | G06N 3/0635 327/62 |
| 5,959,469 A * | 9/1999 | Kurauchi | ............. | H03K 5/249 327/77 |
| 5,973,517 A * | 10/1999 | Kao | ............. | H03K 5/24 327/337 |
| 6,064,239 A * | 5/2000 | Matsuoka | ............. | H03K 5/2481 327/63 |
| 6,069,500 A * | 5/2000 | Kao | ............. | H03K 5/24 327/337 |
| 6,150,850 A * | 11/2000 | Kinoshita | ............. | H03K 5/249 327/337 |
| 6,271,691 B1 * | 8/2001 | Toyoda | ............. | H03F 3/393 327/63 |
| 6,281,831 B1 * | 8/2001 | Shou | ............. | H03M 1/42 327/75 |
| 6,456,170 B1 * | 9/2002 | Segawa | ............. | H03K 5/082 331/143 |
| 6,559,688 B2 * | 5/2003 | Ohkido | ............. | H03K 5/249 327/69 |
| 6,608,503 B2 * | 8/2003 | Shenai | ............. | H03K 5/249 327/337 |
| 2006/0125673 A1 * | 6/2006 | Lee | ............. | H03K 4/50 341/155 |
| 2006/0164368 A1 * | 7/2006 | Tobita | ............. | G09G 3/3648 345/98 |
| 2012/0098690 A1 * | 4/2012 | Dinc | ............. | H03K 3/012 341/155 |
| 2013/0162857 A1 * | 6/2013 | Kwon | ............. | H03M 3/324 348/222.1 |
| 2013/0193981 A1 * | 8/2013 | Chen | ............. | G01R 19/16552 324/537 |

OTHER PUBLICATIONS

Iuri Mehr and Larry Singer, "A 55-mW, 10-bit, 40-Msample/s Nyquist-rate CMOS ADC", IEEE Journal of Solid-State Circuits, vol. 35, No. 3, pp. 318-325, Mar. 2000.

Jan . Craninckx and Geert van der Plas, "A 65fJ/Conversion-Step 0-to-50MS/s 0-to-0.7mW 9b Charge-Sharing SAR ADC in 90nm Digital CMOS", 2007 IEEE International Solid-State Circuits Conference. Digest of Technical Papers, San Francisco, CA, 2007, pp. 246-600.

Iuri Mehr and Declan Dalton, "A 500-Msample/s, 6-bit Nyquist-rate ADC for disk-drive read-channel applications", IEEE Journal of Solid-State Circuits, vol. 34, No. 7, pp. 912-920, Jul. 1999.

H. Jeon and Y. Kim, "A CMOS low-power low-offset and high-speed fully dynamic latched comparator", 23rd IEEE International SOC Conference, Las Vegas, NV, 2010, pp. 285-288.

D. Schinkel et al., "A Double-Tail Latch-Type Voltage Sense Amplifier with 18ps Setup+Hold Time", 2007 IEEE International Solid-State Circuits Conference. Digest of Technical Papers, San Francisco, CA, 2007, pp. 314-605.

Masaya Miyahara et al., "A Low-Noise Self-Calibrating Dynamic Comparator for High-Speed ADCs", 2008 IEEE Asian Solid-State Circuits Conference, Fukuoka, 2008, pp. 269-272.

M. Miyahara et al., "A low-offset latched comparator using zero-static power dynamic offset cancellation technique", 2009 IEEE Asian Solid-State Circuits Conference, Taipei, 2009, pp. 233-236.

N. Verma et al., "An Ultra Low Energy 12-bit Rate-Resolution Scalable SAR ADC for Wireless Sensor Nodes", IEEE Journal of Solid-State Circuits, vol. 42, No. 6, pp. 1196-1205, Jun. 2007.

* cited by examiner

VOLTAGE COMPARATOR FOR OFFSET COMPENSATION

CROSS REFERENCE TO RELATED APPLICATIONS

This application claims priority benefit of Japanese Patent Application No. JP 2019-198285 filed in the Japan Patent Office on Oct. 31, 2019. Each of the above-referenced applications is hereby incorporated herein by reference in its entirety.

BACKGROUND

The present disclosure relates to a voltage comparator.

One of an important basic elements of electronic circuits is a voltage comparator. Comparators are broadly classified into a continuous type and a synchronous type. The synchronous type comparator, also called a clocked comparator, compares voltages at a specific timing synchronized with a clock, and is used as a dynamic comparator that operates only when a clock edge is supplied by combining a sense amplifier, a latch circuit, and the like, thereby having advantages that high-speed operation is possible, power consumption can be reduced because no steady state current flows, and the circuit area can be reduced.

Circuit elements integrated in semiconductor integrated circuits are affected by manufacturing variations. Comparators are no exceptions, and offset errors occur due to the manufacturing variations. The offset error causes an error in determining a minute potential difference. Therefore, various offset cancellation methods have been proposed.

FIG. 1 is a circuit diagram of a comparator 1 having an offset compensation function, which is called a chopper inverter type comparator. In this circuit, inverters 2 are connected in series in multiple stages as a voltage comparison section and an amplification section. Thus, the variation in the threshold voltage of the inverter 2 corresponds to the offset voltage of the comparator.

A switch 3a is provided between an input and an output of an inverter 2a, and a switch 3b is provided between an input and an output of an inverter 2b.

An operation of the comparator 1 will be described.

First, by turning on the switch 3a to cause a short circuit between the input and output of the inverter 2a, an input voltage Vai and an output voltage Vao of the inverter 2a are stabilized at their own threshold voltage Vth1 (self-bias). The similar operation is executed in the second-stage inverter 2b, and by turning on the switch 3b, input/output voltages Vbi and Vbo are stabilized at their own threshold voltage Vth2. By turning on a switch 5p in this state, a voltage ΔV=(Vth1−Vp) is applied to a capacitor 4a in the first stage. A voltage Vp is a voltage which is input to an input terminal INP of the comparator 1. ΔV'=(Vth2−Vth1) is applied to a second stage capacitor 4b. Next, the switches 5p, 3a, and 3b are turned off (sampling).

Subsequently, a switch 5n is turned on. Since the electric charge of the capacitor 4a is retained, the voltage between both ends of the capacitor 4a is invariant, and the input voltage Vai of the inverter 2a satisfies Vai=Vn+ΔV=Vn+Vth1−Vp. A voltage Vn is a voltage which is input to an input terminal INN of the comparator 1. Therefore, when Vn−Vp>0 is satisfied, the output Vao of the inverter 2a decreases, and when Vn−Vp<0 is satisfied, the output Vao of the inverter 2a increases.

When the voltage gain of the inverter 2a is referred to as Ga, the output voltage Vao of the inverter 2a satisfies as follows.

$$Vao = Ga \times (Vai - Vth1) + Vth1$$
$$= Ga \times (Vn - Vp) + Vth1$$

Since the charge of the capacitor 4b is retained, the voltage across the capacitor 4b is invariant, and the input voltage Vbi of the inverter 2b satisfies as follows.

$$Vbi = Vao + \Delta V'$$
$$= Ga \times (Vn - Vp) + Vth1 + (Vth2 - Vth1)$$
$$= Ga \times (Vn - Vp) + Vth2$$

When the voltage gain of the inverter 2b is referred to as Gb, the output voltage Vbo of the inverter 2b is expressed by the following equations.

$$Vbo = Gb \times (Vbi - Vth2) + Vth2$$
$$= Ga \times Gb \times (Vn - Vp) + Vth2$$

The output voltage Vbo of the inverter 2b is compared with the threshold voltage Vth3 of the third stage inverter 2 for binarization. Therefore, when the following inequality is satisfied, voltage comparison that does not depend on the threshold voltages Vth1 to Vth3 of the inverter becomes possible.

$$Ga \times Gb \times |Vn - Vp| \gg |Vth2 - Vth3|$$

As patent documents in the related art, the following patent document and non-patent documents are cited.

[Patent Document 1]
JP 4066211 B1

[Non-Patent Document 1]
G. Van der Plas; S. Decoutere; S. Donnay, "A 0.16pJ/Conversion-Step 2.5 mW 1.25GS/s 4b ADC in a 90 nm Digital CMOS Process", 2006 IEEE International Solid State Circuits Conference—Digest of Technical Papers, San Francisco, Calif., 2006, pp. 2310-.

[Non-Patent Document 2]
I. Mehr and L. Singer, "A 55-mW, 10-bit, 40-Msample/s Nyquist-rate CMOS ADC", IEEE Journal of Solid-State Circuits, vol. 35, no. 3, pp. 318-325, March 2000.

[Non-Patent Document 3]
J. Craninckx and G. van der Plas, "A 65fJ/Conversion-Step 0-to-50MS/s 0-to-0.7 mW 9b Charge-Sharing SAR ADC in 90 nm Digital CMOS", 2007 IEEE International Solid-State Circuits Conference. Digest of Technical Papers, San Francisco, Calif., 2007, pp. 246-600.

[Non-Patent Document 4]
I. Mehr and D. Dalton, "A 500-Msample/s, 6-bit Nyquist-rate ADC for disk-drive read-channel applications", IEEE Journal of Solid-State Circuits, vol. 34, no. 7, pp. 912-920, July 1999.

[Non-Patent Document 5]
H. Jeon and Y. Kim, "A CMOS low-power low-offset and high-speed fully dynamic latched comparator", 23rd IEEE International SOC Conference, Las Vegas, Nev., 2010, pp. 285-288.

[Non-Patent Document 6]

D. Schinkel, E. Mensink, E. Klumperink, E. van Tuijl and B. Nauta, "A Double-Tail Latch-Type Voltage Sense Amplifier with 18ps Setup+Hold Time", 2007 IEEE International Solid-State Circuits Conference. Digest of Technical Papers, San Francisco, Calif., 2007, pp. 314-605.

[Non-Patent Document 7]

Masaya Miyahara, Yusuke Asada, Daehwa Paik and Akira Matsuzawa, "A Low-Noise Self-Calibrating Dynamic Comparator for High-Speed ADCs", 2008 IEEE Asian Solid-State Circuits Conference, Fukuoka, 2008, pp. 269-272.

[Non-Patent Document 8]

M. Miyahara and A. Matsuzawa, "A low-offset latched comparator using zero-static power dynamic offset cancellation technique", 2009 IEEE Asian Solid-State Circuits Conference, Taipei, 2009, pp. 233-236.

[Non-Patent Document 9]

N. Verma and A. P. Chandrakasan, "An Ultra Low Energy 12-bit Rate-Resolution Scalable SAR ADC for Wireless Sensor Nodes", IEEE Journal of Solid-State Circuits, vol. 42, no. 6, pp. 1196-1205, June 2007.

SUMMARY

As a result of examining the comparator 1 in FIG. 1, the present inventor has come to recognize the following problems.

In the comparator 1 in FIG. 1, since a through current $I_{THROUGH}$ flows through the inverter 2 in the state where the switch 3 is on, a steady current is required, and the power consumption is large, so that it is difficult to adopt the comparator 1 for the integrated circuit that requires low power consumption.

Since the voltage gains Ga and Gb per stage of the inverter are small, it is difficult to satisfy the above inequality in a case where a potential difference (Vn–Vp) to be compared is extremely small. In this case, it is necessary to increase the number of stages of the switches 3 and the capacitors 4 to obtain a voltage gain. In that case, a trade-off occurs between a voltage determination level (determinable voltage difference) or a comparative operation speed and power consumption, which causes a problem.

The present disclosure has been made in view of the above problems, and it is desirable to provide a comparator that solves the above-mentioned trade-off problem.

A mode of the present disclosure relates to a synchronous type voltage comparator. The voltage comparator includes a first capacitor, a first inverter and a first switch connected in series and provided between both ends of the first capacitor, a second inverter connected in parallel with the first inverter, a second switch provided between an input and an output of the first inverter, a third switch provided between an input and an output of the second inverter, a second capacitor provided between the output of the first inverter and the input of the second inverter, a third capacitor provided between the output of the second inverter and the input of the first inverter, and a fourth switch provided in one of a position between an upper electrode of the first capacitor and a power supply line and a position between a lower electrode of the first capacitor and a ground line.

It should be noted that any combination of the above components and modifications made by mutually replacing the components and expressions of the present disclosure between methods, devices, systems, and the like are also effective as modes of the present disclosure.

According to a mode of the present disclosure, the offset voltage can be canceled while suppressing an increase in power consumption.

DETAILED DESCRIPTION OF THE PREFERRED EMBODIMENTS

Figure 1:
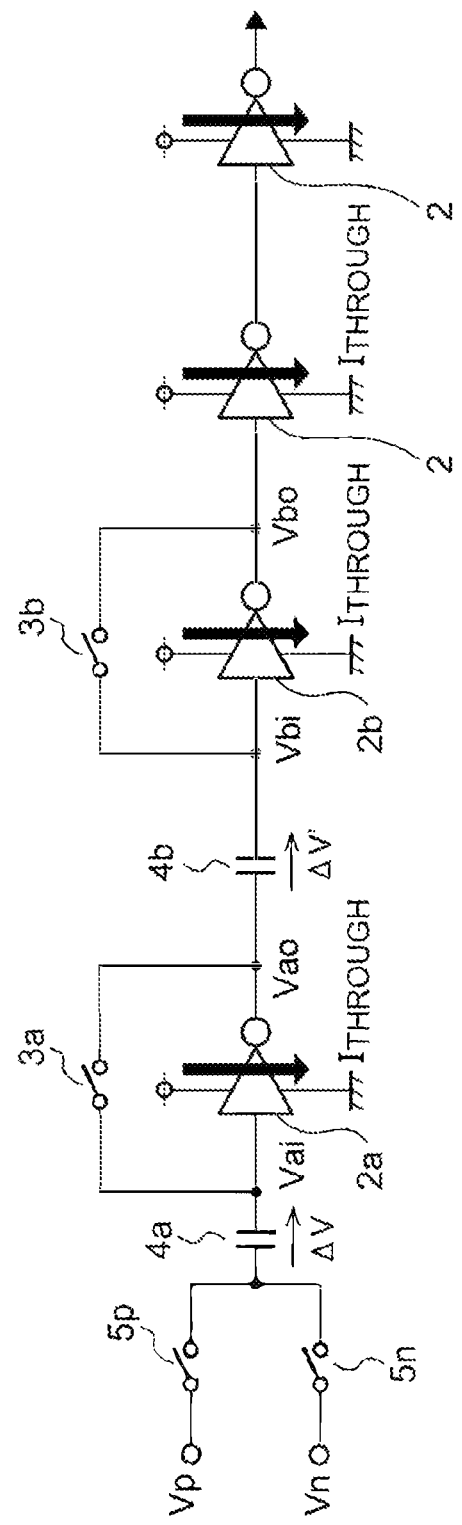
FIG. 1 is a circuit diagram of a comparator having an offset compensation function.

Hereinafter, the present disclosure will be described on the basis of preferred embodiments with reference to the drawings. The same or equivalent components, members, and processes illustrated in the drawings are designated by the same reference numerals, and redundant description will be omitted as appropriate. Further, the embodiments are examples, and the disclosure is not limited thereto, so that all features and combinations described in the embodiments are not necessarily essential to the disclosure.

In the present specification, the "state in which the member A is connected to the member B" includes the case where the member A and the member B are physically and directly connected, and also includes the case where the member A and the member B are indirectly connected through another member which does not substantially affect the electrically connecting state thereof or does not impair the functions and effects produced by the combination thereof.

Similarly, the "state in which the member C is provided between the member A and the member B" includes the case where the member A and the member C, or the member B and the member C are directly connected, and also includes the case where the members are indirectly connected via another member which does not substantially affect the electrically connecting state thereof or does not impair the functions and effects produced by the combination thereof.

Figure 2:
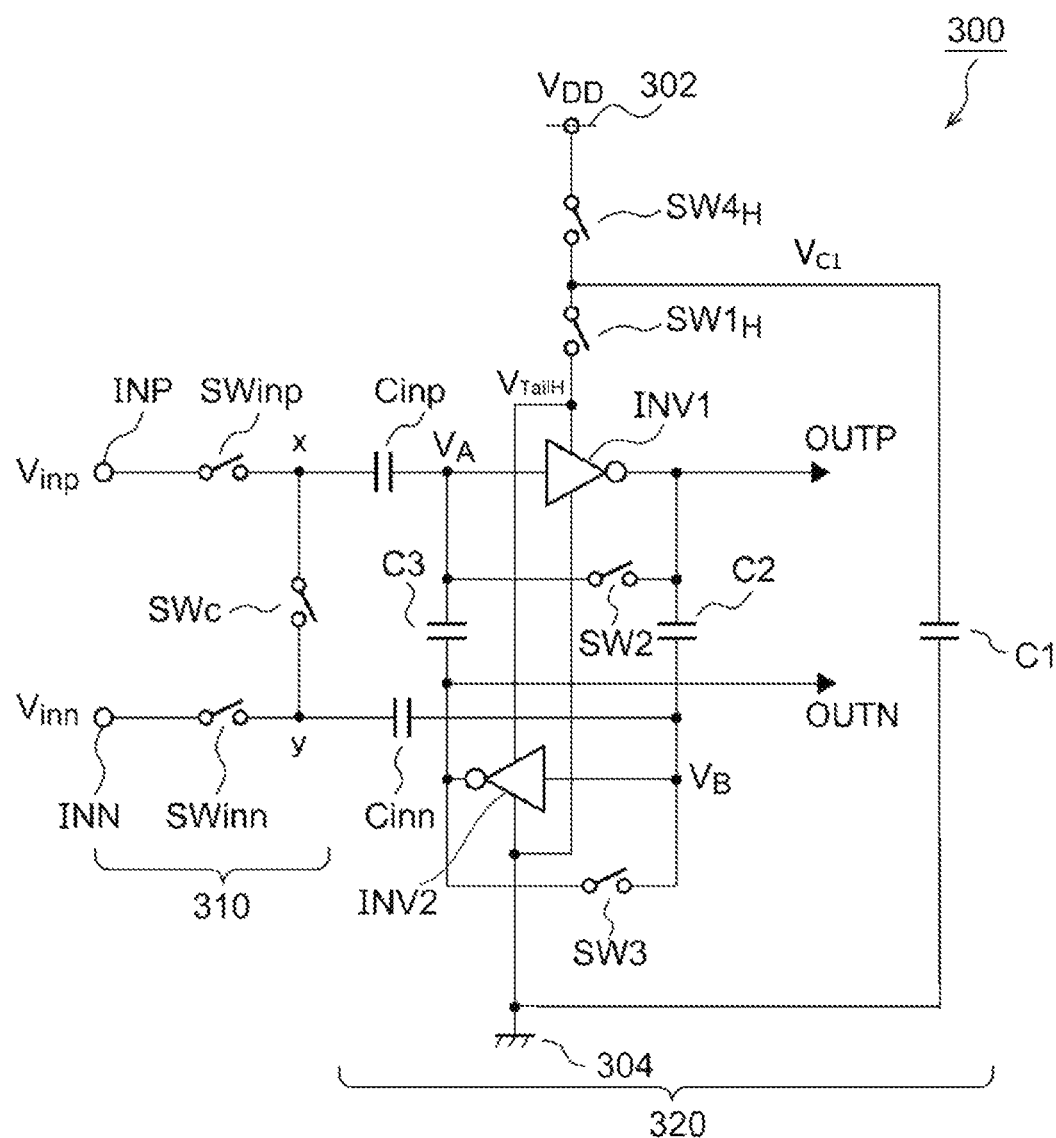
FIG. 2 is a circuit diagram of a synchronous type comparator according to an embodiment.

FIG. 2 is a circuit diagram of a synchronous type comparator 300 according to an embodiment. The comparator 300 compares voltages Vinp and Vinn with each other input to two input terminals INP and INN, and generates a high/low binary output signals OUTP and OUTN indicating the comparison result.

The comparator 300 includes an input stage 310 and a comparison stage 320. The input stage 310 is a sample hold circuit. The configuration of the input stage 310 includes, for example, a first input switch SWinp, a second input switch SWinn, and a third input switch SWc. The configuration of the input stage 310 is not particularly limited, and any configuration according to the form and characteristics of the input signal can be employed as long as a sample operation can be performed before a comparison operation.

The comparison stage 320 includes input capacitors Cinp and Cinn, a first capacitor C1 to third capacitor C3, a first inverter INV1, a second inverter INV2, and a first switch SW1 to a fourth switch SW4.

A power supply and a ground of the first inverter INV1 and a first switch $SW1_H$ are connected in series between both ends of the first capacitor C1. The second inverter INV2 is provided in parallel with the first inverter INV1. The first switch $SW1_H$ is a switch for inactivating the first inverter INV1 and the second inverter INV2 and may be provided on a low potential side of the inverter or is built in each of the inverters INV1 and INV2 as described later.

A second switch SW2 is provided between an input and an output of the first inverter INV1. A third switch SW3 is provided between an input and an output of the second inverter INV2. A second capacitor C2 is provided between the output of the first inverter INV1 and the input of the second inverter INV2. The third capacitor C3 is provided between the output of the second inverter INV2 and the input of the first inverter INV1.

A fourth switch $SW4_H$ is provided in one of a position between an upper electrode Vc1 of the first capacitor C1 and a power supply line 302 and a position between a lower electrode of the first capacitor C1 and a ground line 304 (in this embodiment, the power supply line 302 side). Alternatively, as will be described later (FIG. 6), the fourth switch $SW4_H$ may be provided on each side.

By providing the input capacitors Cinp and Cinn at the input of the comparison stage 320 and using alternating current (AC) coupling, the effect of facilitating a latch operation and eliminating input common mode voltage dependence can be obtained.

Figure 3:
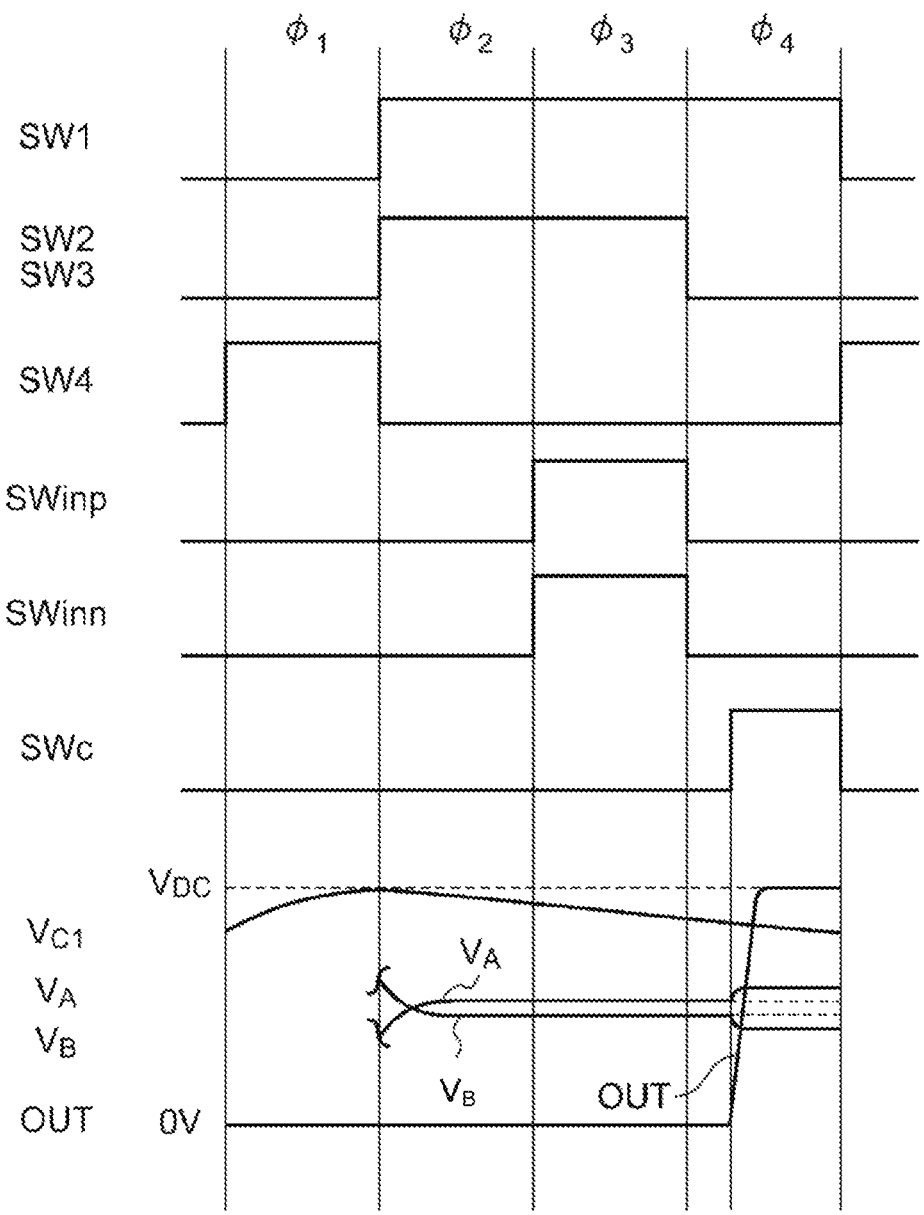
FIG. 3 is a time chart illustrating an example of an operation sequence of the comparator in FIG. 2.

The above is the configuration of the comparator 300. Next, the operation thereof will be described. FIG. 3 is a time chart illustrating the operation of the comparator 300 in FIG. 2.

1. Charging Phase $\phi_1$

First, the fourth switch SW4 is turned on to charge the first capacitor C1. At this time, the first switch SW1 is off. The low state indicates the switch-off state, and the high state indicates the switch-on state.

2. Offset Cancel Phase $\phi_2$

Subsequently, the fourth switch SW4 is turned off to disconnect the first capacitor C1 from the power supply line 302, and the first switch SW1 to the third switch SW3 are turned on.

When the first switch SW1 is turned on, the first inverter INV1 and the second inverter INV2 become operable by the electric charge stored in the first capacitor C1. Then, when the second switch SW2 is turned on, a short circuit is caused between the input and output of the first inverter INV1, and an input voltage $V_A$ is stabilized at the threshold voltage Vth1 of the first inverter INV1. Similarly, when the third switch SW3 is turned on, a short circuit is caused between the input and output of the second inverter INV2, and an input voltage $V_B$ is stabilized at the threshold voltage Vth2 of the second inverter INV2.

3. Sampling Phase $\phi_3$

The switch SWinp is turned on, and the input voltage Vinp on one side is sampled using the capacitor Cinp. Similarly, the switch SWinn is turned on, and the input voltage Vinn on the other side is sampled using the capacitor Cinn. The voltages across the capacitors Cinp and Cinn are Vinp−Vth1 and Vinn−Vth2, respectively.

4. Comparison Phase $\phi_4$

When the switches SWinp and SWinn are turned off, the input voltages Vinp and Vinn are held. Then, the second switch SW2 and the third switch SW3 are turned off. Then, when the switch SWc is turned on, a comparison operation is performed. To be more specific, when the switch SWc is turned on, potentials at one ends of the input capacitors Cinp and Cinn become equal, and electric charge transfer occurs between the two capacitors Cinp and Cinn, so that voltage changes corresponding to a difference ΔV between the voltages Vinp and Vinn are induced to the respective input voltages $V_A$ and $V_B$ of the first inverter INV1 and the second inverter INV2 with reverse polarities.

The above is an operation sequence of the comparator 300. The first inverter INV1 and the second inverter INV2 can be understood as a latch circuit that is AC-cross-coupled via the capacitors C2 and C3 and operate in the same manner as a dynamic latch comparator. A minute potential difference between the two input voltages Vinp and Vinn is amplified by the positive feedback of the latch circuit, and the latch circuit with signal stabilization points at the two points H and L changes at high speed to a state according to a magnitude relation between the input voltages Vinp and Vinn.

The comparator 300 has an offset due to two major factors. The first factor is the capacitance mismatch of the input capacitors Cinp and Cinn, capacitance mismatch of the capacitors C2 and C3, and capacitance mismatch of the wiring parasitic capacitance. Regarding the first factor, due to the characteristics of the semiconductor manufacturing process, it is easy to suppress the mismatch to 1% or less, and the influence is small.

The second factor of the offset of the comparator 300 is the mismatch of the threshold voltages Vth1 and Vth2 of the first inverter INV1 and the second inverter INV2, and although this influence is larger than the capacitance mismatch, according to the present embodiment, it is possible to perform highly accurate voltage comparison that is not affected by variations or fluctuations in the threshold voltages Vth1 and Vth2 of the first inverter INV1 and the second inverter INV2. That is, the offset voltage of the comparator 300 can be suitably canceled.

Further, in the phase $\phi_2$ in which the second switch SW2 and the third switch SW3 are turned on to cancel the offset, the switch SW4 is off, and accordingly, the through current $I_{THROUGH}$ as illustrated in FIG. 1 does not flow, and the power consumption can be reduced.

The two inverters INV1 and INV2 are AC-coupled by the capacitors C2 and C3. Therefore, the influence of direct current (DC) offset can be eliminated.

Further, also in the input stage 310, the influence of the DC offset on the input side can be eliminated by adopting the AC coupling form by the two capacitors Cinp and Cinn. Then, since the circuit functions as a completely symmetrical differential circuit and $V_{TailH}$ and $V_{TailL}$ corresponding to the power supply and the ground of the two inverters INV1 and INV2 become common, the circuit has strong resistance also against crosstalk from an external signal line and common mode noise from the power supply/ground line.

The comparator 300 in FIG. 2 amplifies the potential difference between the input voltages Vinp and Vinn by utilizing the property of transitioning to two stable points, high and low, due to the positive feedback of the latch circuit. Therefore, it is not necessary to connect the inverters in multiple stages as illustrated in FIG. 1, and there is also an advantage that the circuit area can be reduced. That is, in the comparator 1 in FIG. 1, when a plurality of inverters are connected in multiple stages to obtain the gain and amplify the potential difference to a signal amplitude that can be sufficiently determined by the subsequent inverters, the number of stages of the inverters 2 needs to be 4 or more, which is disadvantageous in terms of speed, power consumption, and area. In contrast, according to the comparator 300 in FIG. 2, the number of inverters can be reduced to two, which is advantageous in terms of speed, power consumption, and area in determining a minute potential difference.

Figure 4:
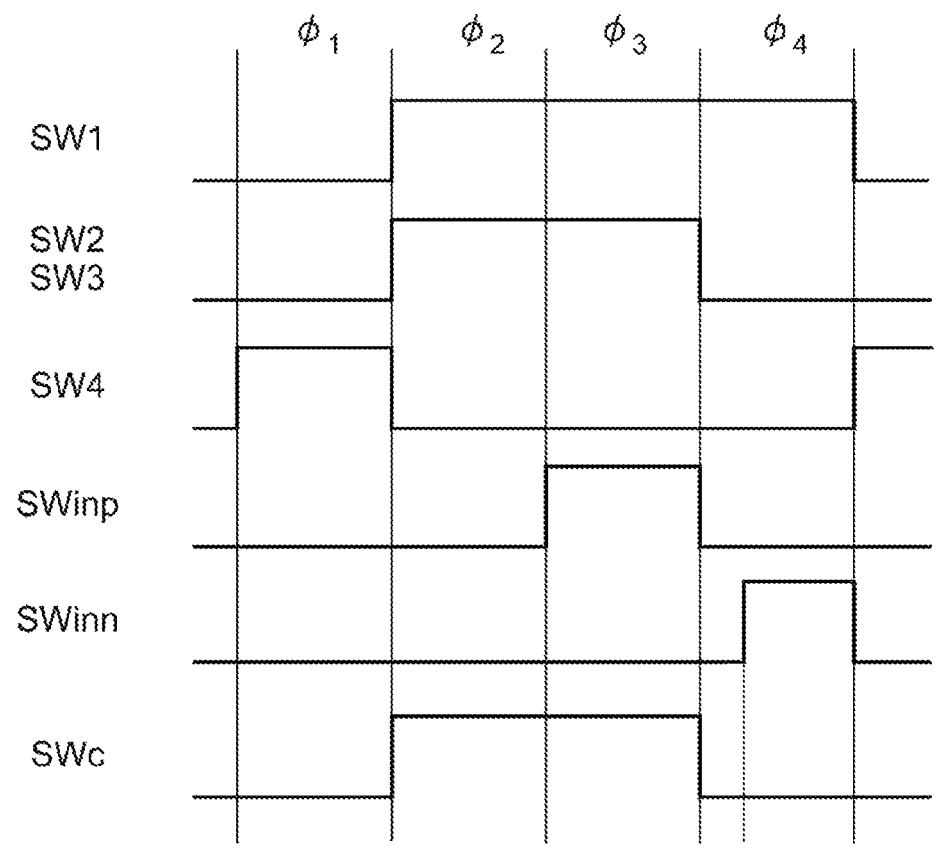
FIG. 4 is a time chart illustrating another example of the operation sequence of the comparator in FIG. 2.

The operation sequence of the comparator 300 in FIG. 2 is not limited to that in FIG. 3 and can be modified or changed. FIG. 4 is a time chart of a modification example of the operation sequence of the comparator 300 in FIG. 2.

1. Charging Phase $\phi_1$

First, the fourth switch SW4 is turned on to charge the first capacitor C1. At this time, the first switch SW1 is off.

2. Offset Cancel Phase $\phi_2$

Subsequently, the fourth switch SW4 is turned off to disconnect the first capacitor C1 from the power supply line 302. Further, the first switch SW1 to the third switch SW3 are turned on. When the first switch SW1 is turned on, the first inverter INV1 and the second inverter INV2 become operable by the electric charge stored in the first capacitor C1.

Then, when the second switch SW2 is turned on, a short circuit is caused between the input and output of the first inverter INV1, and the input voltage $V_A$ is initialized to the threshold voltage Vth1 of the first inverter INV1.

$$V_{A(INIT)} = Vth1$$

Similarly, when the third switch SW3 is turned on, a short circuit is caused between the input and output of the second inverter INV2, and the input voltage $V_B$ is initialized to the threshold voltage Vth2 of the second inverter INV2.

$$V_{B(INIT)} = Vth2$$

According to this modification example, in this phase $\phi_2$, the switch SWc is turned on, so that the wiring (or node) x connecting the switch SWinp and the capacitor Cinp and the wiring (or node) y connecting the switch SWinn and the capacitor Cinn are short-circuited. As a result, the electric charges charged in each of the wirings x and y are discharged, and a difference in electric charges can be removed. Since it is sufficient that a difference between the P input and the N input can be removed, a circuit that applies the same voltage to the nodes x and y may be added instead of the switch SWc. Further, this switch SWc may be turned on in the charging phase $\phi_1$.

3. Sampling Phase $\phi_3$

The switch SWinp is turned on. As a result, the input voltage Vinp on one side is sampled using the capacitors Cinp and Cinn. The voltage between both ends of the capacitor Cinp is Vinp−$V_{A(INIT)}$=Vinp−Vth1, and the voltage ΔVcinn between both ends of the capacitor Cinn satisfies ΔVcinn=Vinp−$V_{B(INIT)}$=Vinp−Vth2.

4. Comparison Phase $\phi_4$

The second switch SW2 and the third switch SW3 are turned off, and the switch SWinn is turned on. Since the electric charge of the capacitor Cinn (voltage between both ends ΔVcinn) is stored, the input voltage $V_B$ of the second inverter INV2 changes from the initial voltage $V_{B(INIT)}$ to $V_B{}'$.

$$V_B{}' = Vinn - \Delta Vcinn$$
$$= Vinn - (Vinp - Vth2)$$
$$= (Vinn - Vinp) + Vth2$$

Accordingly, the output of the second inverter INV2 is low when (Vinn−Vinp)>0 is satisfied and high when (Vinn−Vinp)<0 is satisfied, and the comparison stage 320 is latched in a state depending on a magnitude relation between the input voltages Vinp and Vinn.

The present disclosure extends to various devices and methods understood as a block diagram or a circuit diagram in FIG. 2 or derived from the above description, and is not limited to a specific configuration. Hereinafter, more specific configuration examples and practical examples will be described not to narrow the scope of the present disclosure but to help with understanding the essence and operation of the disclosure and to clarify these.

Figure 5:
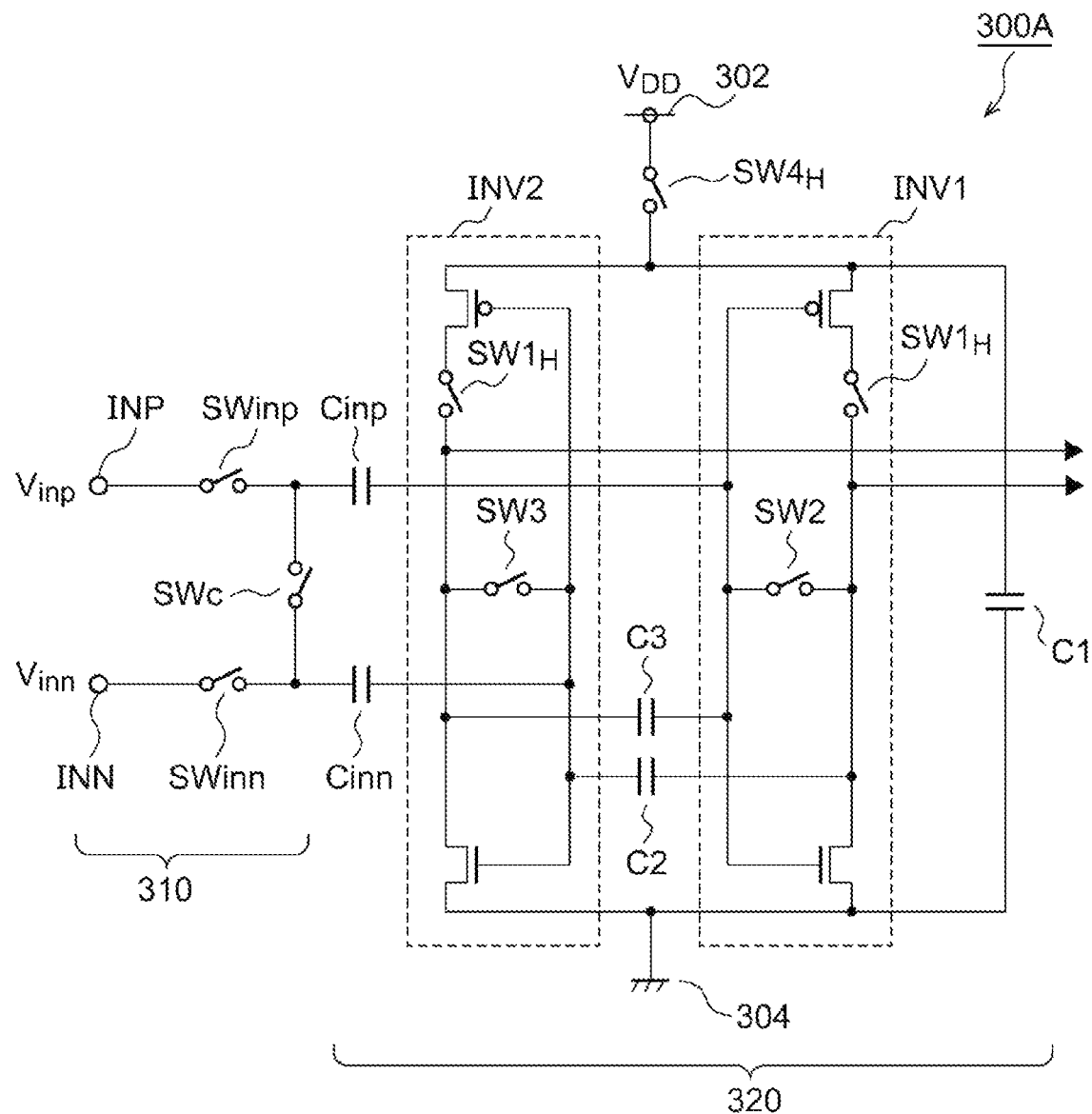
FIG. 5 is a circuit diagram of a comparator according to an embodiment.

FIG. 5 is a circuit diagram of a comparator 300A according to an embodiment. In this example, the first switch $SW1_H$ in FIG. 2 is provided inside each of the first inverter INV1 and the second inverter INV2. In this example, the first switch $SW1_H$ is provided between the output of each inverter and a drain of the high-side transistor (PMOS transistor). The arrangement of the first switch $SW1_H$ is not limited to this, and the switch may be provided between a source of the PMOS transistor and the fourth switch $SW4_H$. Alternatively, the switch may be provided on the NMOS transistor side. In short, the first switch SW1 may be provided at such a position that the discharge of the electric charge of the first capacitor C1 via the first inverter INV1 and the second inverter INV2 can be prevented.

Figure 6:
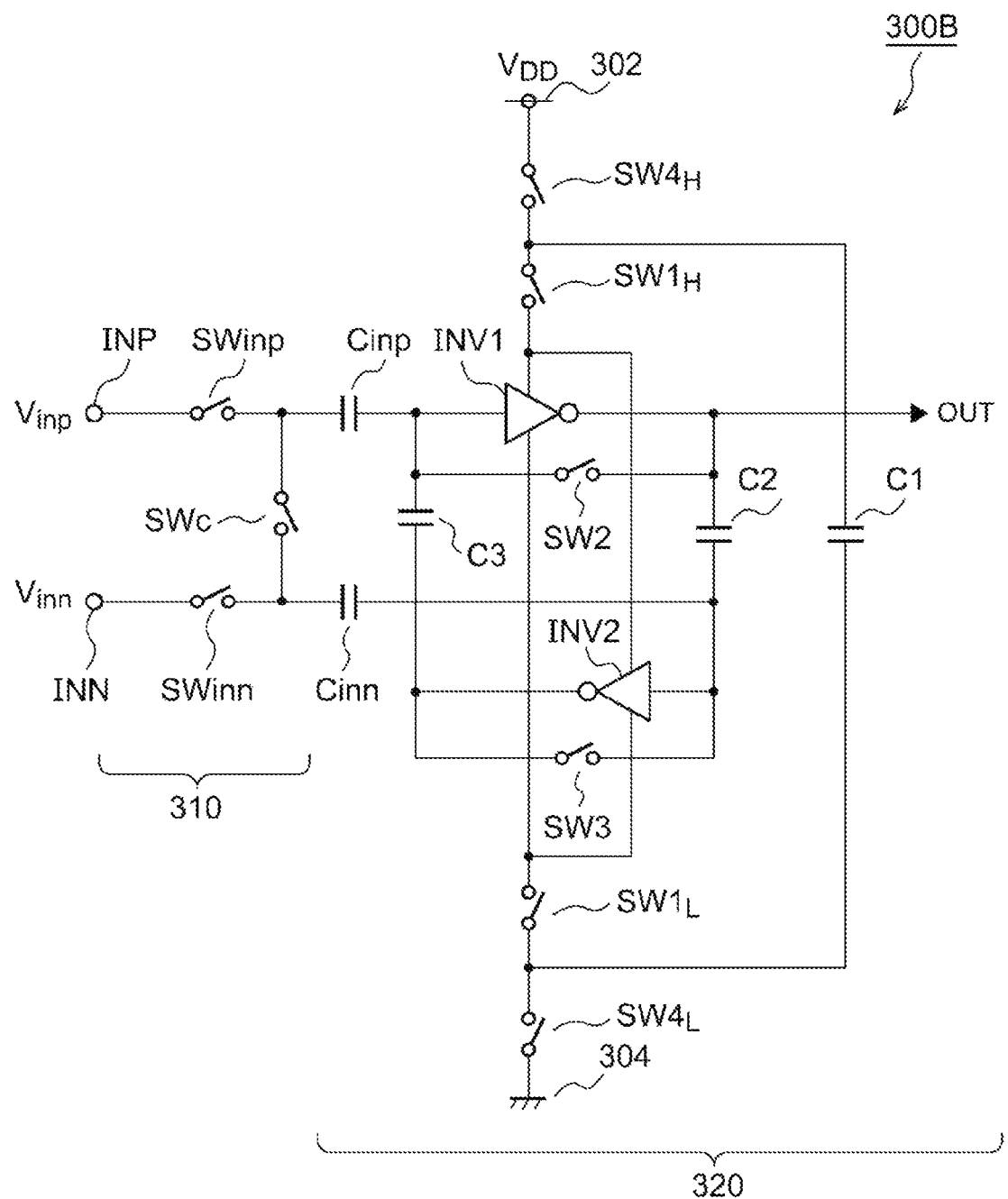
FIG. 6 is a circuit diagram of a comparator according to an embodiment.

FIG. 6 is a circuit diagram of a comparator 300B according to an embodiment. In this example, in addition to the fourth switch $SW4_H$ on the power supply line 302 side, a fourth switch $SW4_L$ is also provided on the ground line 304 side. Further, first switches $SW1_H$ and $SW1_L$ are provided on both the power supply line 302 side and the ground line 304 side.

Figure 7:
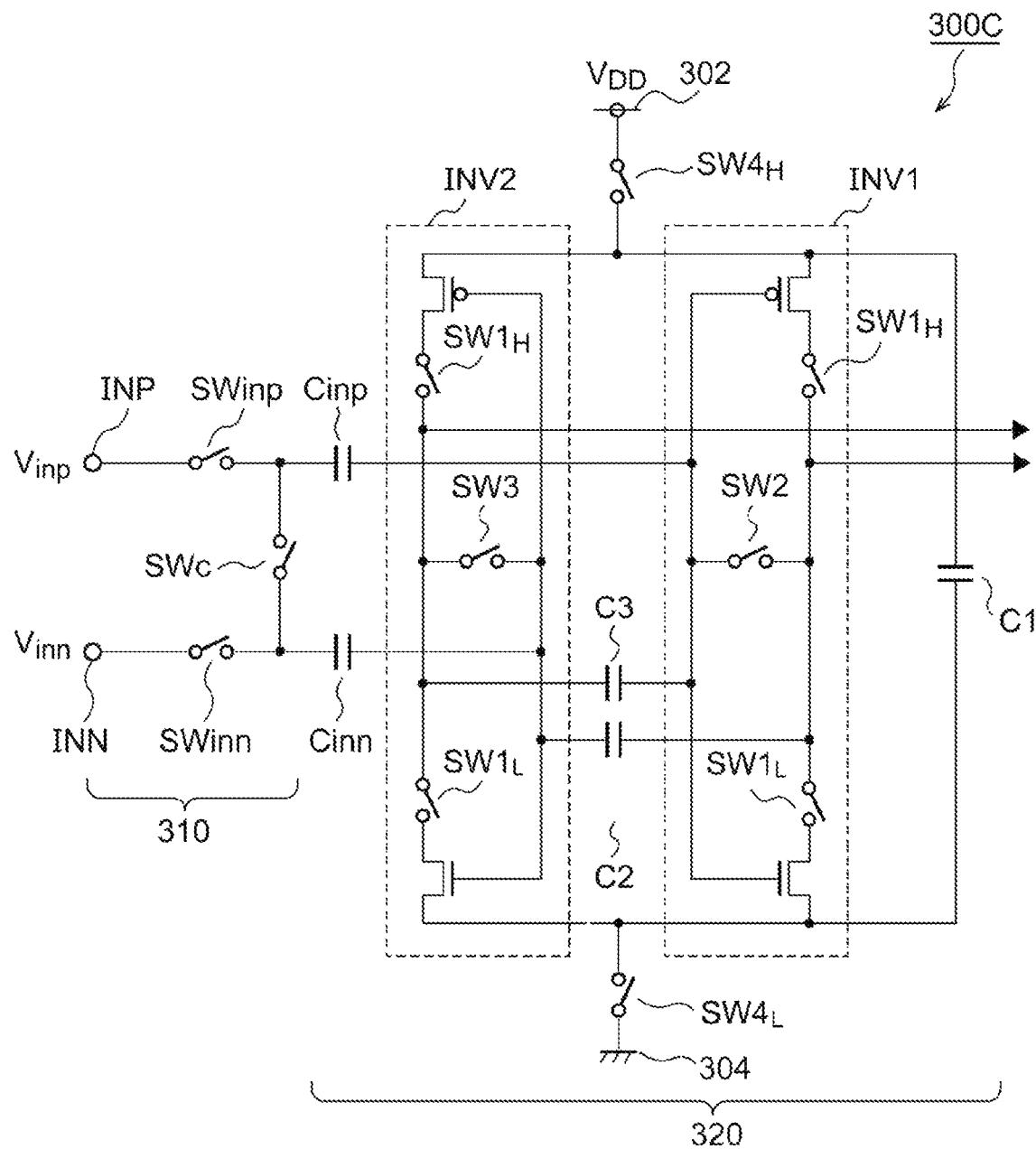
FIG. 7 is a circuit diagram of a comparator according to an embodiment.

FIG. 7 is a circuit diagram of a comparator 300C according to an embodiment. In this embodiment, the first switches $SW1_H$ and $SW1_L$ in FIG. 6 are incorporated in each of the inverters INV1 and INV2.

Figure 8:
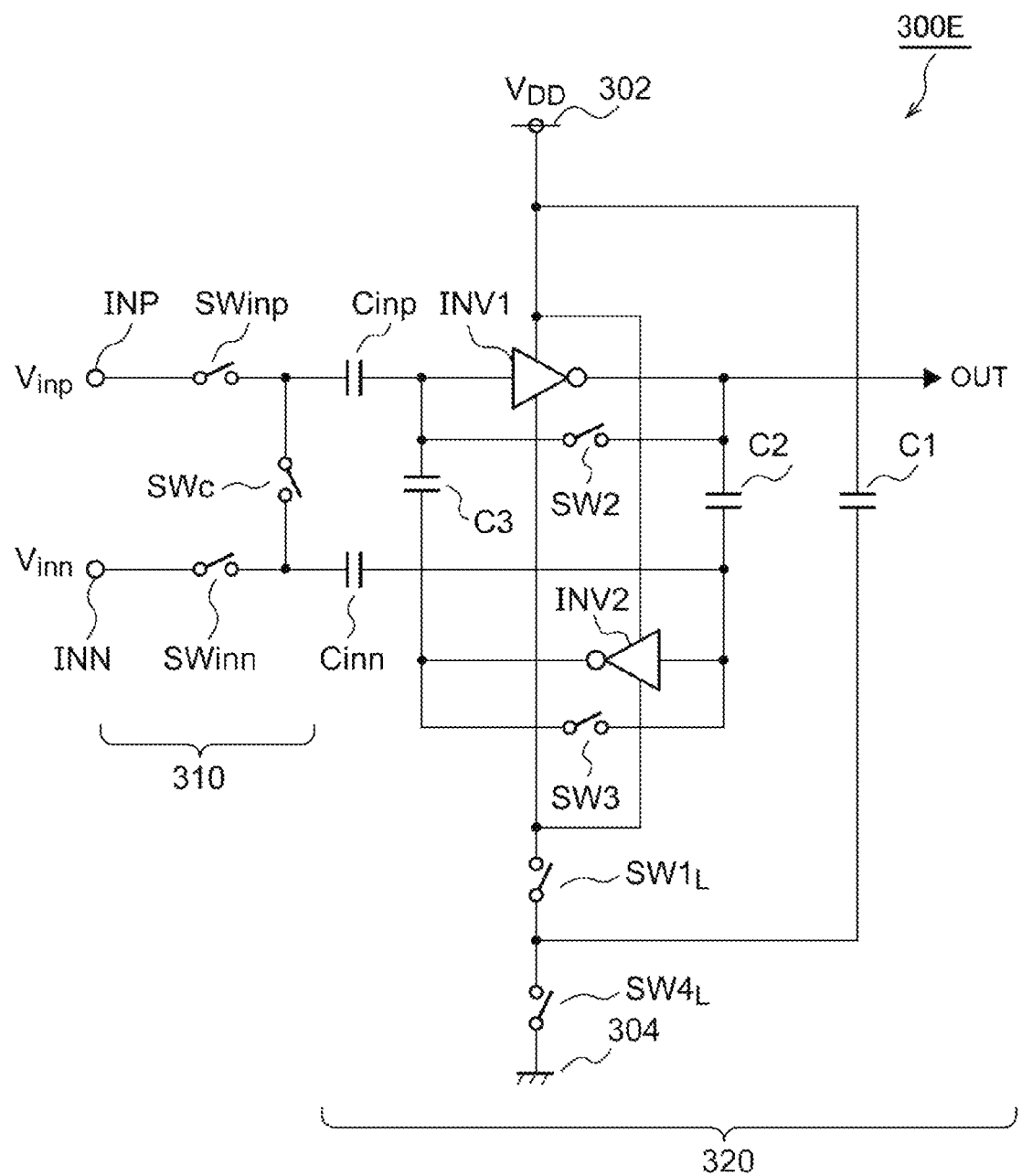
FIG. 8 is a circuit diagram of a comparator according to an embodiment.

FIG. 8 is a circuit diagram of a comparator 300E according to an embodiment. In this example, the first switch $SW1_L$ and the fourth switch $SW4_L$ are provided only on the ground line 304 side. In the track of FIG. 7, the first switch $SW1_L$ may be incorporated into the inverters INV1 and INV2.

Subsequently, modification examples of the input stage 310 will be described.

Figure 9A:
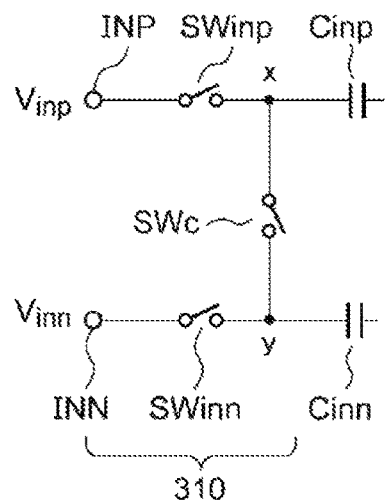
FIGS. 9A to 9D are circuit diagrams illustrating modification examples of an input stage.
Figure 9B:
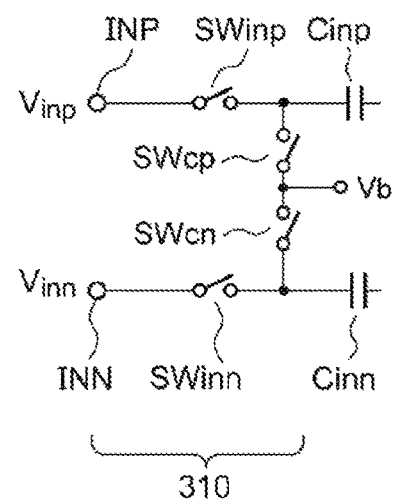
Figure 9C:
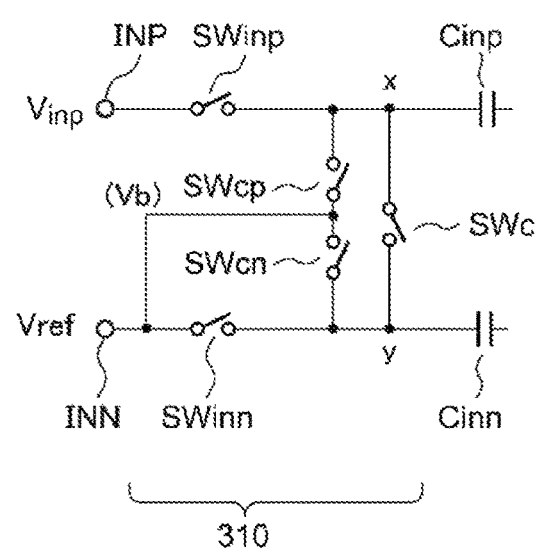

FIGS. 9A to 9C are circuit diagrams illustrating modification examples of the input stage 310 of a single-ended input. The input stage 310 in FIG. 9A is similar to that in FIG. 2 or the like.

The input stage 310 of FIG. 9B includes two input switches SWcp and SWcn instead of the third input switch SWc in FIG. 9A. As a result, a predetermined voltage Vb can be applied to one ends x and y of the capacitors Cinp and Cinn during the comparison operation, so that a shift in an amount of charge due to noise or the like can be prevented. The voltage Vb may be a ground voltage, a power supply voltage, or an intermediate voltage.

The input stage 310 in FIG. 9C can be understood as a combination of FIGS. 9A and 9B. One of the input voltages is a reference voltage Vref, and the reference voltage Vref is applied to the nodes x and y as the predetermined voltage Vb via the switches SWcp and SWcn.

Figure 9D:
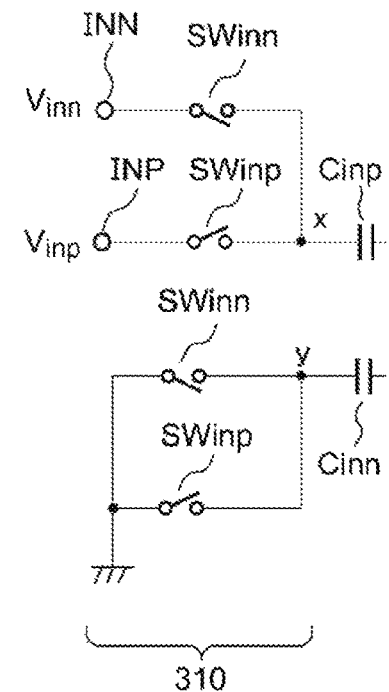

The input stage 310 in FIG. 9D is controlled in the same manner as the comparator 1 in FIG. 1. This type is useful when an output impedance of a circuit (for example, a buffer) connected to the previous stage of the input stage 310 is sufficiently low.

Although the single-ended comparator has been described in the above description, the present disclosure can also be applied to a differential type comparator.

Figure 10:
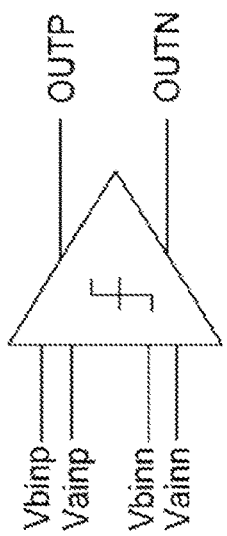
FIG. 10 is a circuit diagram of a comparator according to an embodiment.
Figure 10:
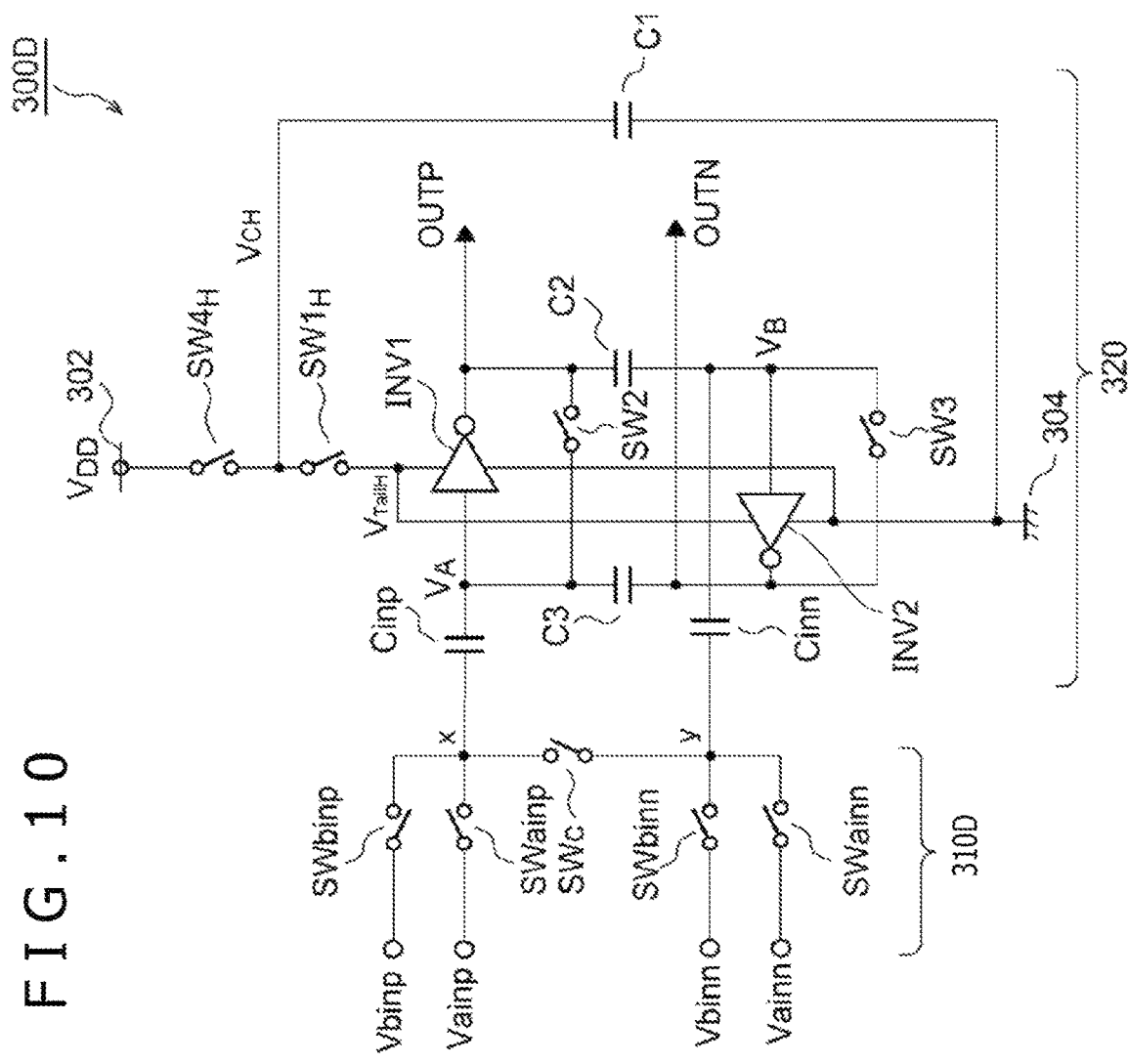

FIG. 10 is a circuit diagram of a comparator 300D according to an embodiment. This comparator 300D is a fully differential type. Two differential signals Vain(p/n) and Vbin(p/n) are input to the comparator 300D, and the comparator 300D compares the differential component of one differential signal Vain(p/n) with the differential component of the other differential signal Vbin(p/n).

Here, although the comparison stage 320 of the comparator 300D that is the same as that in FIG. 2 is illustrated, other comparison stages may be employed.

An input stage 310D includes a plurality of input switches SWap, SWan, SWbp, and SWbn in addition to the capacitors Cinp and Cinn, and the third input switch SWc.

Figure 11:
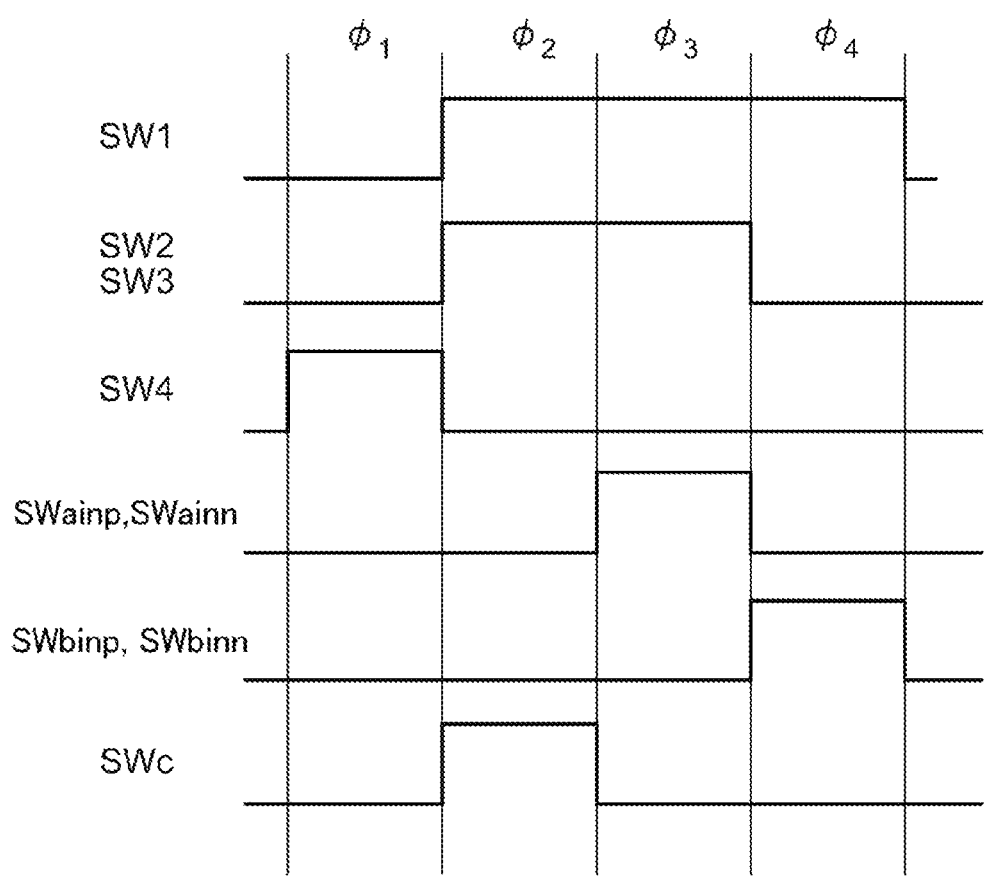
FIG. 11 is an operation waveform diagram of the comparator in FIG. 10.

Subsequently, the operation of the comparator 300D in FIG. 10 will be described. FIG. 11 is an operation waveform diagram of the comparator 300D in FIG. 10.

1. Charging Phase $\phi_1$

First, the fourth switch SW4 is turned on to charge the first capacitor C1. At this time, the first switch SW1 is off.

2. Offset Cancel Phase $\phi_2$

Subsequently, the fourth switch SW4 is turned off to disconnect the first capacitor C1 from the power supply line 302, and the first switch SW1 to the third switch SW3 are turned on. At this time, the switch SWc is also turned on. When the first switch SW1 is turned on, the first inverter INV1 and the second inverter INV2 become operable by the electric charge stored in the first capacitor C1.

Then, when the second switch SW2 is turned on, a short circuit is caused between the input and output of the first inverter INV1, and the input voltage $V_A$ is initialized to the threshold voltage Vth1 of the first inverter INV1.

$$V_{A(INIT)} = Vth1$$

Similarly, when the third switch SW3 is turned on, a short circuit is caused between the input and output of the second inverter INV2, and the input voltage $V_B$ is initialized to the threshold voltage Vth2 of the second inverter INV2.

$$V_{B(INIT)} = Vth2$$

In the offset cancel phase $\phi_2$, the switch SWc is turned on, and a difference between the charges of the wirings (nodes) x and y is removed.

3. Sampling Phase $\phi_3$

The switch SWc is turned off, and switches SWainp and SWainn are turned on. The capacitor Cinp is charged at the following voltage $\Delta Vp$.

$$\Delta Vp = (Vainp - V_{A(INIT)}) = Vainp - Vth1$$

Similarly, the capacitor Cinn is charged at the following voltage $\Delta Vn$.

$$\Delta Vn = (Vainn - V_{B(INIT)}) = Vainn - Vth2$$

4. Comparison Phase $\phi_4$

The switches SWainp and SWainn, the second switch SW2, and the third switch SW3 are turned off, and switches SWbinp and SWbinn are turned on instead. Since the charge of the capacitor Cinp is stored, the input voltage $V_A$ of the first inverter INV1 transitions to the following voltage $V_A'$.

$$V_A' = Vbinp - \Delta Vp$$
$$= Vbinp - (Vainp - Vth1)$$
$$= (Vbinp - Vainp) + Vth1$$

The first inverter INV1 transitions to a state corresponding to a magnitude relation between the voltage $V_A'$ of its own input node and its own threshold voltage Vth1. That is, the output is low when Vbinp−Vainp>0 is satisfied, and the output is high when Vbinp−Vainp<0 is satisfied.

Similarly, since the electric charge of the capacitor Cinn is stored, the input voltage $V_B$ of the second inverter INV2 transitions to the following voltage $V_B'$.

$$V_B' = Vbinn - \Delta Vn$$
$$= Vbinn - (Vainn - Vth2)$$
$$= (Vbinn - Vainn) + Vth2$$

The second inverter INV2 transitions to a state according to a magnitude relation between the voltage $V_B'$ of its own input node and its own threshold voltage Vth2. That is, the output is low when Vbinn−Vainn>0 is satisfied, and the output is high when Vbinn−Vainn<0 is satisfied.

As described above, the two inverters INV1 and INV2 form a latch circuit, and the positive feedback of the latch circuit makes it possible to obtain a voltage comparison result at high speed.

In the comparator 300D in FIG. 10, Vbinp, Vbinn and Vainn can be short-circuited to operate the comparator as a single-ended comparator, which is equivalent to the configuration in FIG. 9C.

In the comparator 300D in FIG. 10, in a case where the output impedance of the circuit (for example, buffer) connected to the previous stage thereof is sufficiently low, the third input switch SWc may be omitted.

The comparator 300 is useful for various applications that require high accuracy and low power consumption.

Although the present disclosure has been described using specific terms on the basis of the embodiments, the embodiments merely indicate the principles and applications of the present disclosure, and many modifications and arrangement changes are permitted for the embodiments without departing from the ideas of the present disclosure defined in the claims.

It should be understood by those skilled in the art that various modifications, combinations, sub-combinations and alterations may occur depending on design requirements and other factors insofar as they are within the scope of the appended claims or the equivalent thereof.

What is claimed is:

1. A voltage comparator comprising:
   a first capacitor;
   a first inverter and a first switch connected in series and provided between both ends of the first capacitor;
   a second inverter connected in parallel with the first inverter;
   a second switch provided between an input and an output of the first inverter;

a third switch provided between an input and an output of the second inverter;
a second capacitor provided between the output of the first inverter and the input of the second inverter;
a third capacitor provided between the output of the second inverter and the input of the first inverter; and
a fourth switch provided in one of a position between an upper electrode of the first capacitor and a power supply line and a position between a lower electrode of the first capacitor and a ground line.

2. The voltage comparator according to claim 1, further comprising:
another fourth switch provided in another of the position between the upper electrode of the first capacitor and the power supply line and the position between the lower electrode of the first capacitor and the ground line.

3. The voltage comparator according to claim 1, wherein the first switch includes two switches,
a first of the two switches is provided on an upper side of the first inverter, and
a second of the two switches is provided on a lower side of the first inverter.

4. A voltage comparator comprising:
a first capacitor;
a first inverter provided between both ends of the first capacitor;
a first switch provided in one of an upper electrode of the first capacitor or between a lower electrode of the first capacitor and the first inverter or provided inside the first inverter;
a second inverter connected in parallel with the first inverter, the second inverter having a same configuration as the first inverter;
a second switch provided between an input and an output of the first inverter;
a third switch provided between an input and an output of the second inverter;
a second capacitor provided between the output of the first inverter and the input of the second inverter;
a third capacitor provided between the output of the second inverter and the input of the first inverter; and
a fourth switch provided in one of a position between an upper electrode of the first capacitor and a power supply line and a position between a lower electrode of the first capacitor and a ground line.

5. The voltage comparator according to claim 4, further comprising:
another fourth switch provided in another of the position between the upper electrode of the first capacitor and the power supply line and the position between the lower electrode of the first capacitor and the ground line.

6. The voltage comparator according to claim 4, wherein the first switch includes two switches,
a first of the two switches is provided on an upper side of the first inverter, and
a second of the two switches is provided on a lower side of the first inverter.

* * * * *